United States Patent [19]

Nakatani et al.

[11] 4,045,817
[45] Aug. 30, 1977

[54] SEMICONDUCTOR OPTICAL IMAGE SENSING DEVICE

[75] Inventors: Hirokuni Nakatani; Toru Takamura, both of Takatsuki; Susumu Hashimoto, Katano, all of Japan

[73] Assignee: Matsushita Electronics Corporation, Osaka, Japan

[21] Appl. No.: 657,697

[22] Filed: Feb. 12, 1976

[30] Foreign Application Priority Data

Feb. 20, 1975 Japan .................................. 50-21633

[51] Int. Cl.² ..................... H04N 3/14; H03K 3/42; H01J 39/12; H03K 23/12
[52] U.S. Cl. .................................. 358/213; 250/578; 307/208; 307/220 C; 307/311
[58] Field of Search ............... 250/578; 307/208, 238, 307/220 R, 220 C, 221 R, 221 C, 221 D, 311, 251; 357/24; 358/213

[56] References Cited

U.S. PATENT DOCUMENTS

| 3,626,193 | 12/1971 | Ishihara et al. | 307/311 X |
| 3,662,188 | 5/1972 | Williams | 307/208 X |
| 3,717,770 | 2/1973 | Dyck et al. | 250/211 J |
| 3,904,818 | 9/1975 | Kovac | 178/7.1 |

OTHER PUBLICATIONS

Chai et al., "Noise Compensator for Charge-Coupled Devices"; IBM Tech. Discl. Bull.; vol. 16, No. 4, pp. 1099–1100; 9/1973.

Primary Examiner—John S. Heyman
Assistant Examiner—Larry N. Anagnos
Attorney, Agent, or Firm—Stevens, Davis, Miller & Mosher

[57] ABSTRACT

A semiconductor optical image sensing device having a signal line connected to the drain electrodes of MOS field effect transistors each corresponding to a picture element, wherein the source electrodes of the MOS field effect transistors are connected to photo-diodes, capacitors of MOS structures are connected between the gate electrodes of the MOS field effect transistors and a noise line, and the signal line and the noise line are connected to input terminals of a differential amplifier. The capacitors of MOS structures are formed in the same way as the gates and drains of the MOS field effect transistors. By applying a scanning pulse to the gate electrodes of the MOS field effect transistors to scan the MOS field effect transistors for switching the same, a signal output and a noise output are produced from the signal line while another noise output is produced from the noise line. The signal to noise ratio can be enhanced by producing only the signal output from the differential amplifier.

7 Claims, 3 Drawing Figures

SEMICONDUCTOR OPTICAL IMAGE SENSING DEVICE

The present invention relates to a semiconductor optical image sensing device.

In a prior art serial readout one-dimensional optical image sensing device or serial readout two-dimensional optical image sensing device using a MOS integrated circuit, a problem of spurious noise spikes has occured due to the leakage of a signal readout scanning pulse to a video output line through the gate-drain capacitance of a switching MOS field effect transistor (hereinafter referred to as MOST), the scanning pulse being applied to a gate electrode of the MOST to switch the same. Particularly when the optical input to the optical image sensing device is small, the signal is embedded in the noise and hence the noise must be eliminated by some means.

Figure 1:
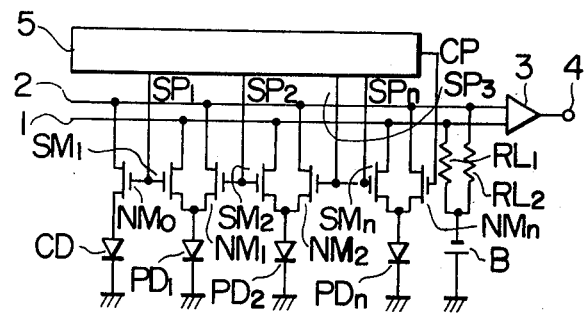
FIG. 1 is a circuit diagram of a prior art semiconductor optical image sensing device.

In the light of the above problem, it has been proposed to eliminate the noise using a differential amplifier in the manner shown in FIG. 1. The prior art method for eliminating the noise is explained in conjunction with FIG. 1 which shows a specific circuit configuration of an optical image sensing device using a differential amplifier. It comprises photo-diodes $PD_1, \ldots PD_n$, a clearing photo-diode CD which is optically shielded and normally in a dark state, signal readout switching MOST's $SM_1 \ldots SM_n$ and noise readout switching MOST's $NM_0 \ldots NM_n$. A signal line 1 and a noise line 2 are connected to the drain electrodes of the signal readout switching MOST's $SM_1 \ldots SM_n$ and the drain electrodes of the noise readout switching MOST's $NM_0 \ldots NM_n$, respectively. The signal line 1 and the noise line 2 are also connected to input terminals of a differential amplifier 3 and further connected to a power supply B through load resistors $RL_1$ and $RL_2$, respectively. When a first scan pulse $SP_1$ from a scanning pulse generator 5 is simultaneously applied to the gate electrodes of the noise readout switching MOST $NM_O$ and the signal readout switching MOST $SM_1$, the MOST's $NM_O$ and $SM_1$ conduct. The sum of the optical signal stored in the photo-diode $PD_1$ and spike noise due to the gate-drain capacitance of the MOST $SM_1$ appear on the signal line 1. Since the clearing photo-diode CD is in the dark state, only spike noise due to the gate-drain capacitance of the noise readout switching MOST $NM_O$ appear on the noise line 2. The noise readout switching MOST $NM_O$ and the signal readout switching MOST $SM_1$ are constructed quite identically so that the spike noise which appear on the signal line 1 and the noise line 2 are substantially the same. Accordingly, when the outputs appearing on the signal line 1 and the noise line 2 are amplified by the differential amplifier 3, only the optical signal component is produced. Then, when a second scan pulse $SP_2$ is simultaneously applied to the gate electrodes of the noise readout switching MOST $NM_1$ and the signal readout switching MOST $SM_2$, the noise readout switching MOST $NM_1$ and the signal readout switching MOST $SM_2$ conduct. The sum of an optical signal stored in the photo-diode $PD_2$ and spike noise due to the gate-drain capacitance of the signal readout switching MOST $SM_2$ appear on the signal line 1. In this case, since the signal stored in the photo-diode $PD_1$ has just been readout, only a noise spikes due to the gate-drain capacitance of the noise readout switching MOST $NM_1$ appears on the noise line 2. When the outputs on the signal line 1 and the noise line 2 are amplified differentially, only an optical signal component is produced. In the same manner, the outputs appearing on the signal line 1 and the noise line 2 are differentially amplified in sequence to readout the optical signals stored in the photo-diodes $PD_1, \ldots PD_n$. In this type of optical image sensing device, it is necessary to connect the noise readout switching MOST $NM_n$ in the final stage to the photo-diode $PD_n$ and apply a clearing pulse CP to the gate electrode of the noise readout switching MOST $NM_n$ in order to maintain the photo-diode $PD_n$ in the final stage in the same state as the other photo-diodes. In the prior art optical image sensing device having this arrangement, many problems exist in that the source electrodes of the noise readout switching MOST's $NM_O, \ldots NM_n$ must be connected to the anodes of the photo-diodes CD, $PD_1, \ldots PD_n$, respectively, and hence the location of the noise readout switching MOST's $NM_O, \ldots NM_n$ is restricted. Further, the clearing pulse CP is required or the clearing photo-diode CD and the final stage noise readout switching MOST $NM_n$ are required and these occupy undue space on the substrate surface. Also although the clearing photo-diode CD of the initial stage is optically shielded it stores a non-optical signal due to thermal excitation or the like and when this non-optical signal is differentially amplified the differential amplifier 3 produces a spurious signal thereof as noise. In addition, although spike noise appears on the noise line by the clearing pulse CP for clearing the final stage photo-diode $PD_n$ due to the gate-drain capacitance of the final stage noise readout switching MOST $NM_n$, no such spike noise appears on the signal line 1 at that time and hence when the outputs on the signal line and the noise line are differentially amplified, only the spike noise appears at the output terminal 4 of the differential amplifier 3.

It is, therefore, an object of the present invention to provide a semiconductor optical image sensing device having a high signal to noise ratio.

It is another object of the present invention to provide a semiconductor optical image sensing device wherein the location of noise readout switching MOST's is not restricted and a high packing density is attained.

These and other objects, features and advantages of the present invention will become more apparent from the following detailed description of the preferred embodiment of the invention when taken in conjunction with the accompanying drawings.

Figure 2:
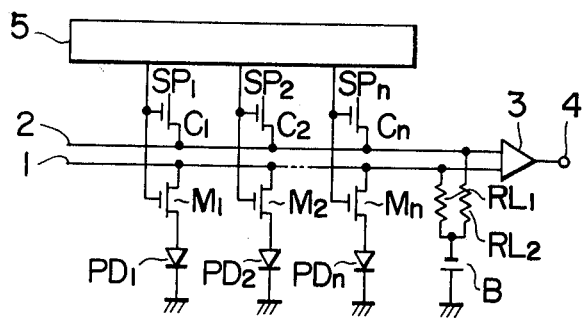
FIG. 2 is a circuit diagram illustrating one embodiment of a semiconductor optical image sensing device of the present invention.

Now referring to FIG. 2, photo-sensing devices $PD_1, \ldots PD_n$ are connected to source electrodes of switching MOST's $M_1, \ldots M_n$, respectively, and a first output line 1 is connected to the drain electrodes of the switching MOST's $M_1, \ldots M_n$. Gate electrodes of MOS capacitors C1, ... Cn are connected to the gate electrodes of switching MOST's M1, ... Mn, respectively, and the drain electrodes of MOS capacitors C1, ... Cn are connected to a second output line 2. The first output line 1 and the second output line 2 are also connected to input terminals of a differential amplifier 3 and further connected to a power supply B through load resistors $RL_1$ and $RL_2$, respectively. The photo-sensing devices $PD_1, \ldots PD_n$ may be formed by photo-diodes or photo-transistors.

When scanning pulses $SP_1, \ldots SP_n$ are applied from a scanning pulse generator 5 to the gate electrodes of the switching MOST's $M_1, \ldots M_n$ in sequence, the switching MOST's $M_1, \ldots M_n$ conduct sequentially and charges corresponding to optical signals that have been stored in the photo-sensing devices $PD_1, \ldots PD_n$ during a storage period are supplied by a power supply B connected to load resistors $RL_1$. At this time, the sum of the optical signal and a spike noise appears on the first output line 1 connected to the load resistor $RL_1$ through the MOST's $M_1 \ldots M_n$ and only the spike noise appears on the second output line 2 connected to the load resistor $RL_2$, through the MOS capacitors $C_1, \ldots C_n$. If the MOS capacitors $C_1, \ldots C_n$ are constructed in the same structure as the gatedrain structures of the switching MOST's $M_1, \ldots M_n$, the spike noise component on the first output line and the spike noise component on the second output line are identical. Therefore, when the output on the first output line 1 and the output on the second output line 2 are amplified by a differential amplifier 3, a signal component which is free from the noise component appears at an output terminal 4 of the differential amplifier 3.

Figure 3:
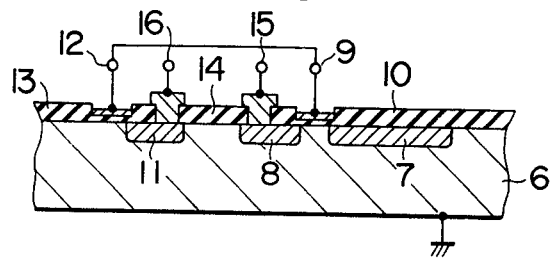
FIG. 3 is a fragmentary sectional view of a structure of the semiconductor optical image sensing device shown in FIG. 2.

Referring to FIG. 3, a photo-diode is formed between an N-type semiconductor monocrystalline substrate 6 and a P+ diffusion layer 7 and a switching MOST is formed with the P+ diffusion layer 7 being the source region, a P+ diffusion layer 8 being the drain electrode and an electrode 9 being the gate electrode. A MOS capacitor is formed between a P+ diffusion layer 11 and a gate electrode 12. The gate electrode 9 of the switching MOST and the gate electrode 12 of the MOS capacitor are interconnected with each other. The drain electrode 15 of the switching MOST and the drain electrode 16 of the MOS capacitor are isolated by an isolation layer 14 and connected to the first output line 1 and the second output line 2, respectively. A similar construction may be used when a P-type semiconductor monocrystalline substrate is used instead of the N-type semiconductor monocrystalline substrate. An optical image sensing device having the above mentioned structures has been developed in view of the problem that the spike noise is produced in a gate-drain capacitance of the MOST. In the optical image sensing device of the present invention, the noise reading MOS capacitor may have the same capacity as the gate-drain capacity of the switching MOST, with the result that the MOS capacitors may be located anywhere on the substrate. Thus, no restriction on the location exists, and the surface area occupied thereby can be reduced. Furthermore, as compared with the prior art device shown in FIG. 1, it is unnecessary in the present invention to provide a connection between the source of the noise reading MOST and the anode of the photo-diode, thus reducing the number of interconnections. In the prior art device shown in FIG. 1, the number of interconnections per picture element are three whereas in the device of the present invention shown in FIG. 2, only two interconnections exist resulting in high packing density. In addition, the device of the present invention is constructed to have a "one stage-one diode" structure so that a first stage clearing diode (CD), a final stage clearing switching MOST ($NM_n$) and a clearing pulse supply means (CP) are not needed thereby providing additional high packing density. In addition to high packing density of the photo-sensing devices, there is provided an optical image sensing device having high resolution power which is applied to a low noise high bit and high density one or two-dimensional optical image sensing device.

What is claimed is:

1. A semiconductor optical image sensing device comprising:

a power supply;

first and second load means;

a differential amplifier;

first and second output lines connected to said differential amplifier and to one terminal of said power supply through said first and second load means, respectively;

a plurality of MOS capacitors each having a current conducting electrode and a control electrode, each current conducting electrode of said MOS capacitors being connected to said second output line;

a plurality of photo-sensing devices, the number of photo-sensing diodes being at least equal to the number of MOS capacitors; and a plurality of MOS field effect transistors each having first and second current conducting electrodes and a control electrode, the number of MOS field effect transistors being at least equal to the number of MOS capacitors, said first current conducting electrode of each of said MOS field effect transistors being connected to said first output line, said second current conducting electrode of each of said MOS field effect transistors being connected to the other terminal of said power supply through a corresponding one of said photo-sensing devices respectively and the control electrode of each of said MOS field effect transistors being connected to the control electrode of the corresponding one of said MOS capacitors.

2. A semiconductor optical image sensing device according to claim 1 wherein respective ones of said MOS field effect transistors, said photo-sensing devices and said MOS capacitors constitute a picture element.

3. A semiconductor optical image sensing device according to claim 1 wherein a scanning pulse generator is connected to said control electrodes.

4. A semiconductor optical image sensing device according to claim 1 wherein said photo-sensing devices are photo-diodes.

5. A semiconductor optical image sensing device according to claim 1 wherein said first current conducting electrodes are drain electrodes and said second current conducting electrodes are source electrodes.

6. A semiconductor optical image sensing device according to claim 1 wherein said MOS field effect transistors, said photo-sensing devices and said MOS capacitors are formed in one and the same semiconductor substrate.

7. A semiconductor optical image sensing device according to claim 1 wherein said photo-sensing devices are formed in the source regions of said MOS field effect transistors.

* * * * *